United States Patent [19]

Mahmood

[11] Patent Number: 5,248,906
[45] Date of Patent: Sep. 28, 1993

[54] HIGH SPEED CMOS OUTPUT BUFFER CIRCUIT MINIMIZES OUTPUT SIGNAL OSCILLATION AND STEADY STATE CURRENT

[75] Inventor: Qazi Mahmood, San Jose, Calif.

[73] Assignee: Advanced Micro Devices, Inc., Sunnyvale, Calif.

[21] Appl. No.: 897,736

[22] Filed: Jun. 12, 1992

[51] Int. Cl.⁵ .......................................... H03K 19/00
[52] U.S. Cl. ...................................... 307/443; 307/451; 307/475; 307/263
[58] Field of Search ............... 307/443, 451, 475, 263, 307/296.8

[56] References Cited

U.S. PATENT DOCUMENTS

| | | |
|---|---|---|
| 4,622,482 | 11/1986 | Gauger ............................ 307/263 X |
| 4,894,561 | 1/1990 | Nogami .......................... 307/451 X |
| 4,972,101 | 11/1990 | Pantovi et al. ................... 307/443 |
| 4,975,598 | 12/1990 | Borkar ............................. 307/443 |
| 4,975,599 | 12/1990 | Petrovick, Jr. et al. ........... 307/443 |
| 5,017,807 | 5/1991 | Kriz et al. ....................... 307/443 |

*Primary Examiner*—David R. Hudspeth
*Attorney, Agent, or Firm*—Joseph A. Sawyer, Jr.

[57] ABSTRACT

An output buffer circuit is disclosed that minimizes signal oscillation or ringing on a data bus while limiting the power dissipated. This circuit includes a pair of reference voltage generators which provide clamp voltages that limit the signal oscillation and a mechanism for shutting down the appropriate generator when it is not operating. The output buffer circuit has the capability of driving the output transistors to their CMOS levels in order to maximize the sinking and sourcing currents.

11 Claims, 7 Drawing Sheets

HIGH SPEED CMOS OUTPUT BUFFER CIRCUIT MINIMIZES OUTPUT SIGNAL OSCILLATION AND STEADY STATE CURRENT

FIELD OF THE INVENTION

This invention relates to an output buffer circuit utilized to provide a voltage level to a data bus and more particularly to an improved output buffer circuit which provides better immunity to the power supply and semiconductor processing changes.

BACKGROUND OF THE INVENTION

High speed, high current bus driver circuits for an output buffer are utilized to rapidly charge or discharge a data bus to a high or low voltage level. Typically, when this rapid charging and discharging occurs the resulting effect can often be a damped oscillation or ringing of current flowing through the buffer. This ringing effect is undersirable because it can cause false information or false data to be provided to the bus.

The network formed by the output buffer, its interconnects and the load on the data bus can be represented by an RLC equivalent circuit. In this type of equivalent circuit, the inductance, L, is due to the inherent parasitic self inductance of the leads connected to the buffer circuit, the capacitance C is due to the capacitive load of the devices connected to the bus, and the resistance R is the resistance of the charging or discharging path.

The resistance R acts as a dissipating element in order that the oscillation of the circuit decays. The ratio of the resistance R and the critical resistance factor $2(L/C)^{\frac{1}{2}}$ determines the amount of damping the circuit will experience while dissipating its power.

This damped ringing can cause unintentional triggering of the devices connected to the data bus if the voltage amplitude of an oscillation cycle exceeds the logical threshold of the device. Since this damped oscillation will also be present on the power supply lines of the bus driver circuit, other circuits such as an input buffer circuit sharing the same power line will likely experience voltage failures due to the distortion of the power supply voltage. Finally, a noisy power supply is likely to cause ringing on the data which has been driven to that power rail by other bus drivers sharing the power line. This ringing is likely to happen regardless of the amount of self inductance L that the other bus drivers have on their leads.

The voltage amplitude of this damped ringing is a function of the rate change of the current (di/dt). Since the values of the parasitic physical elements L and C of the driver network are constant, their effect on the current cannot be altered. However, one possible way of controlling the rate of change of current would be to control the flow of current through the driver transistors that form a portion of the output buffer circuit.

With this solution there is a trade off between propagation delay which slows the bus driver circuit down and the clamping voltage or the amplitude of the signals that are provided to the gates of the driver transistors. A circuit addressing this problem is described in U.S. Pat. No. 4,877,980, entitled, "Time Variant Drive Circuit For High Speed Bus Driver To Limit Oscillation Or Ringing On A Bus," and assigned to the assignee of this patent application. In this patent a bias voltage ($V_{bias}$) is applied to one of gate of a p channel and n channel transistor pair. In this patent the bias voltage is chosen to prevent ringing on the bus. Although the invention described in this patent works satisfactorily for its intended purposes, it does not disclose a means for providing the $V_{bias}$ voltage. The driver circuit disclosed in this patent does not show as implementation that will minimize oscillation while minimizing the power. For the low voltage situations the minimizing of power is a critical feature.

Accordingly, what is needed is a circuit for providing a voltage to the driver transistors of a driver circuit that is flexible and is simple to implement. What is also needed, is a an output buffer circuit which minimizes the damped ringing or oscillation problem associated with previously known output buffer circuits at the same time it is not appreciably effected by the propagation delays that can be generated when regulating the rate of change of the current. Finally, what is needed is an output buffer circuit which will use a limited amount of power in operation.

The present invention provides a output buffer circuit which controls the amplitude and slew rate of the gate voltages of the driver transistors while providing better immunity to power supply changes and process variations that are inherent in the semiconductor device. The output buffer circuit also includes means for limiting the power dissipated while maximizing its current sinking and sourcing capability.

SUMMARY OF THE INVENTION

The present invention discloses an output buffer circuit which drives the data bus in two steps in order to minimize oscillation. First, the data bus is driven by applying a gate voltage on the driver transistor which is clamped at an intermediate level between $V_{ss}$ and $V_{cc}$. This is achieved by a pair of reference voltage generators which regulate the amplitude and the slew rate of the gate voltages of the bus driver transistors. These reference voltage generators are designed to provide better immunity to the process and power supply changes. At least one of the generators also applies a mechanism which obtains a controlled ramp of voltage on the gate of the driver transistor. Step one results in a controlled driving of the data bus thereby minimizing the voltage oscillation. In step two, after a desired voltage level on the data bus is obtained, the appropriate reference voltage generator is turned off.

This power down method prevents any dc power drain through these generators during steady state operating condition. Subsequently, the gate of the driver transistor of this output buffer is driven to the full CMOS levels for steady state operating condition. Full CMOS levels on the gates of the driver transistors maximize the sinking and the sourcing currents of the driver transistors. The output buffer circuit provides same delay for the "data to out" and the "enable to out" paths. During switching of the output from one level to another, the buffer circuit prevents simultaneous turn on of the large driver transistors, thereby minimizing dc current. In this output buffer circuit, with enable signal low, fast access for tri-stating the driver transistors is achieved.

DETAILED DESCRIPTION OF THE INVENTION

The present invention relates to an improvement in output buffer circuit technology. The following description is presented to enable one of ordinary skill in the art to make and use the invention and is provided in the context of a patent application and its requirements. Various modifications to the preferred embodiments will be readily apparent to those skilled in the art and the generic principles defined herein may be applied to other embodiments. Thus, the present invention is not intended to be limited to the embodiments shown, but is to be accorded the widest scope consistent with the principles and features described herein.

Figure 1:
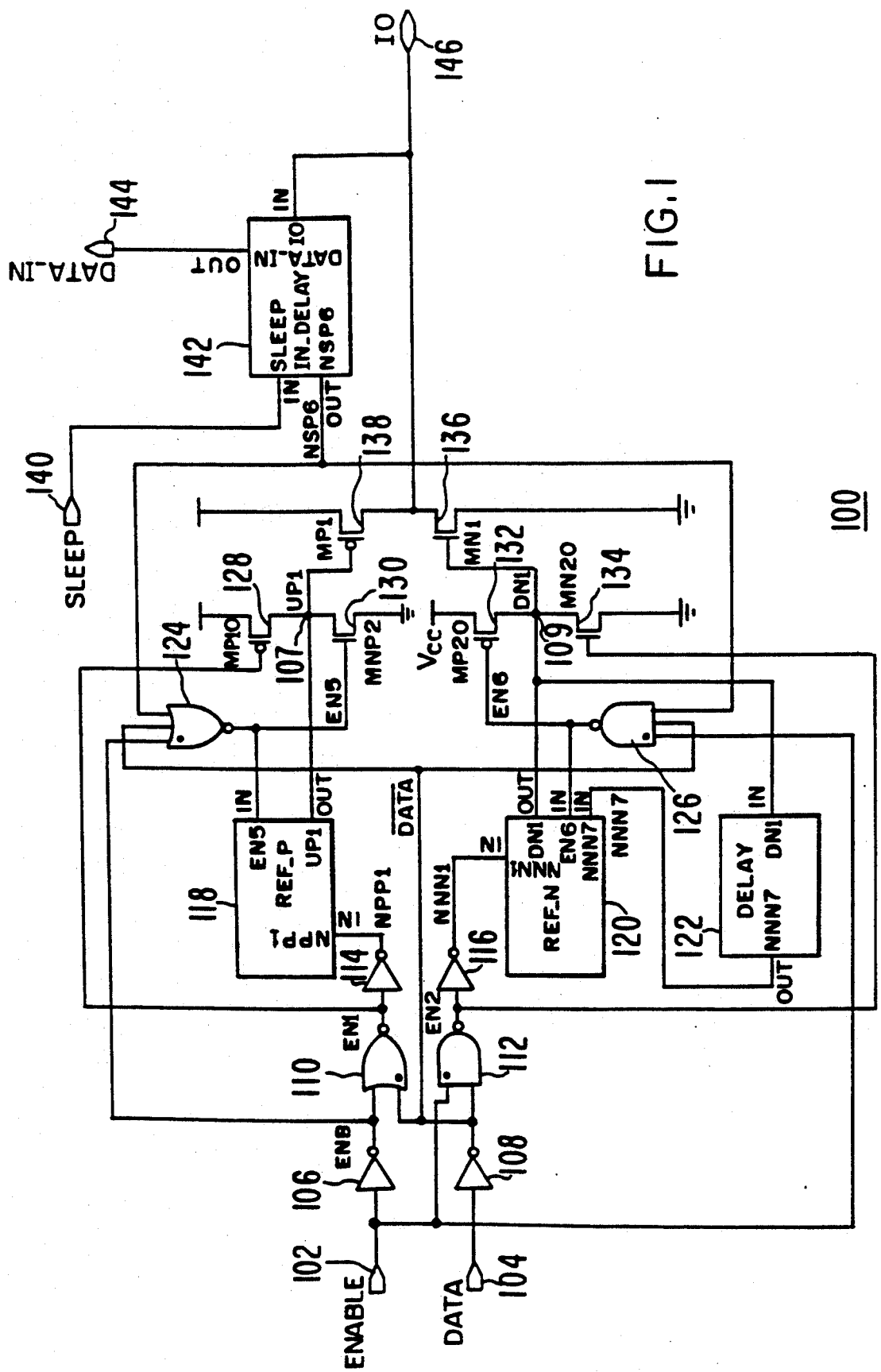
FIG. 1 shows in block diagram form a output buffer circuit in accordance with the present invention.

A diagram representative of a output buffer circuit 100 in accordance with the present invention is shown in FIG. 1. The output buffer circuit includes an enable input 102 and data input 104. The enable input 102 is coupled to the input of invertor 106. The data input 104 is coupled to input of invertor 108. The output of invertor 106 is coupled to one input of an two input NOR gate 110. The output of invertor 108 is coupled to one input of two input NAND gate 112 and the second input of NOR gate 110. The enable input 110 is coupled to a second input of NAND gate 112.

The enable input 102 is coupled to the first input of three input NAND gate 126. The output of inverter 106 is coupled to a first input of three input NOR gate 124. The second and third inputs of NOR gate 124 and NAND gate 126 are coupled together.

The output of NOR gate 110 is coupled to the input of invertor 114. The output of NAND gate 112 is coupled to the input of invertor 116. The output of invertor 114 is coupled to the NPP1 input of Ref_p generator 118. The output of invertor 116 is coupled to the NNN1 input of Ref_n voltage generator 120. Node EN6 of Ref_n voltage generator 120 is coupled to the output of NAND 126. Node EN5 of Ref_p voltage generator 118 is coupled to the output of NOR gate 124. NNN7 input pin is coupled to an output of delay 122. The node dn1 109 of Ref_n generator 120 is coupled to the dn1 input of Delay 122.

The output of NAND gate 126 is coupled to the gate PMOS transistor 132. The source of transistor mp20 pmos 132 is coupled to $V_{CC}$. The drain of transistor 132 is coupled to node dn1 109 output. The output of NAND gate 112 is coupled to the gate of mn20 nmos transistor 134. The source of transistor 134 is coupled to $V_{ss}$ or ground and the drain of transistor 134 is coupled to node dn1 109. Node dn1 109 is coupled to the gate of mn1 nmos driver transistor 136. The source of transistor 136 is coupled to ground and the drain is coupled to IO 146.

The output NOR gate 110 is coupled to the gate of mp10 pmos transistor 128. The source of transistor 128 is coupled to $V_{CC}$ and the drain of transistor 128 is coupled to the up1 107 output of Ref_n generator 118. The EN5 out of Ref_n 118 is coupled to the gate of mnp2 nmos transistor 130. The source of transistor 130 is coupled to ground and its drain is coupled to up1 107. The output of up1 107 is coupled to the gate of mp1 pmos driver transistor 138. The source of transistor 138 is coupled to $V_{CC}$ and the drain is coupled I/O 146.

A sleep input 140 is supplied to In_Delay 142. A output of In_Delay 142 is coupled to the third inputs of NOR gate 124 and NAND gate 126. DATA_in output 144 is provided from In-Delay 142. I/O 146 is coupled to the IO input of In_Delay 142.

Two of the key elements of this circuit are the two reference voltage generators labeled Ref_p 118 and Ref_n voltage generator 120. These voltage generators 118 and 120 provide two basic functions. First, they provide a voltage clamp (when powered up) on the nodes up1 107 and dn1 109 which drive the gates of the driver transistors 138 and 136. Secondly, these generators 118 and 120 also provide some propagation delay for signals npp1 and nnn1 when they drive signals up1 107 and dn1 109 respectively. The propagation delay is present only during the period when the transistors 138 or 136 are being turned on. The purpose of the propagation delay is to prevent the transistors 138 and 136 from turning on simultaneously when the output of the output buffer circuit 100 switches from one level to another.

It is known that by selecting a clamp voltage that is between 2 times and 4 times the threshold value of the transistor both the amplitude of the output oscillation and the total propagation delay through the bus driver circuit are minimized. It is also known that in low voltage applications (3-5 volts) by setting the clamp voltage value at 2-4 times the threshold value of the transistor the tradeoff between propagation delay and ringing can be optimized.

Figure 2A:
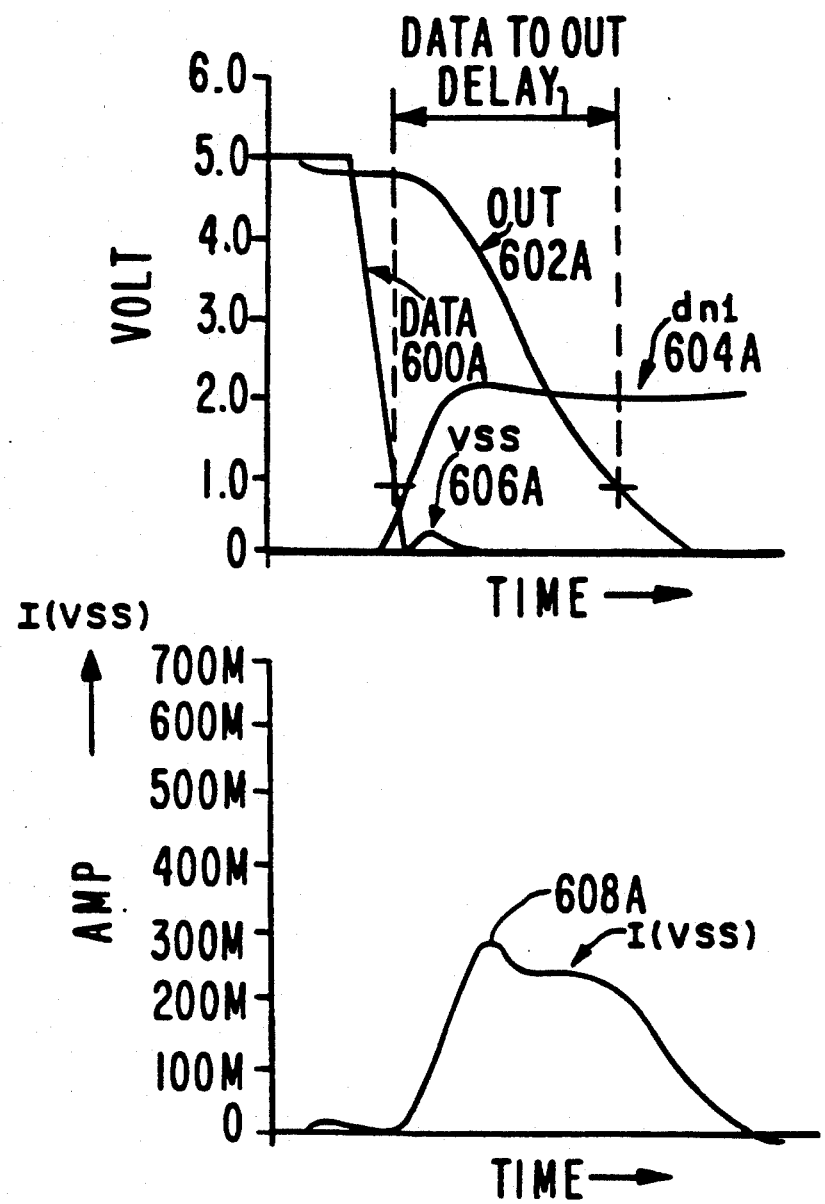
FIGS. 2(a)-2(c) are diagrams that illustrates the effect of ringing or signal oscillation at different clamp voltage levels.
Figure 2B:
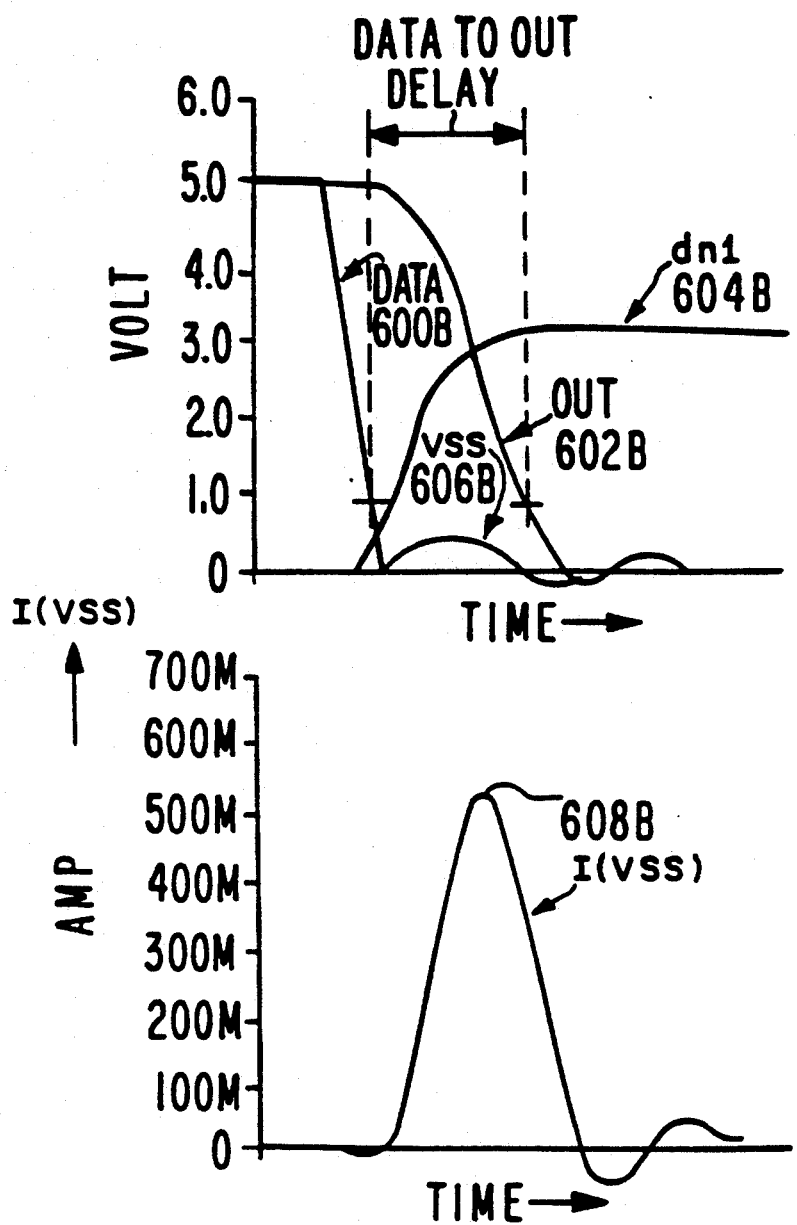
Figure 2C:
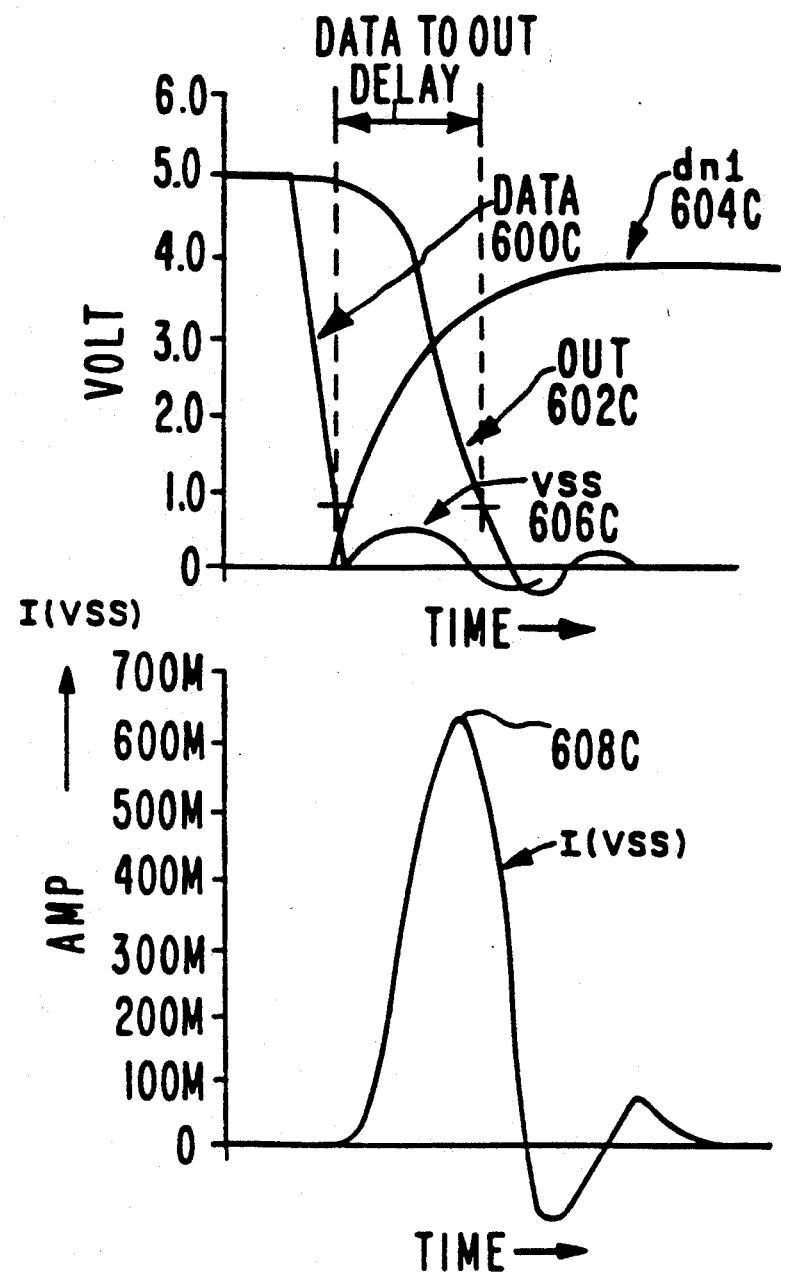

Referring now to FIGS. 2(A) through 2(C) shown are diagrams which are illustrative of the voltage and current transient analysis for an output buffer 100 in which the clamp voltage is 2 $V_T$, 3 $V_T$ and 4 $V_T$ respectively. The following discussion is directed toward the operation of an Ref_n voltage generator 120 but it will be well recognized by one of ordinary skill in the art that the generator can be a Ref_p generator 118 and the diagrams will be complementary in nature.

For review purposes, the curves marked 600A through 600C are the data into circuit 100 for 2 $V_T$ voltage generator, 3 $V_T$ voltage generator, and 4 $V_T$ voltage generator respectively. The curves 602A through 602C are the output from the circuits from the same respective clamp voltages.

The curves 604A through 604C are the voltages at node dn1 of the circuit 100 at the same clamp voltages as mentioned above. The curves 606A through 606C are the ringing voltages on $V_{ss}$ line that are present at the above mentioned clamp voltages. Finally, the curves 608A through 608C are the ringing current produced on the $V_{SS}$ line at the respective clamp voltages mentioned above.

What is seen is that the response time as indicated by the output curves 602A through 602C, for the 4 $V_T$ voltage generator is much faster than that for the 2 $V_T$ voltage generator. However, it is also seen that the voltage ringing is much higher for the 4 $V_T$ voltage generator (606C) than for the 2 $V_T$ voltage generator 606A.

It is also very clear that the current ringing (608C) using a 4 $V_T$ reference voltage generator is much higher than the 2 $V_T$ voltage generator (608A). Hence, as is seen, the 3 $V_T$ voltage generator's response time 602 B is much better than the 2 $V_T$ voltage generator 602 A and at the same time the ringing 606B is somewhat less than that shown at the 4 $V_T$ voltage generator (606C). Therefore, generally the best compromise is to provide the 3 $V_T$ voltage generator.

However, if there is no concern about ringing, the 4 $V_T$ voltage generator can be utilized. Conversely, if a output buffer circuit 100 is desired that is relatively immune to signal oscillation, a 2 $V_T$ reference generator would be utilized. Therefore, for example, a lower clamp voltage at node dn1 109 will reduce the oscillation amplitude, but the delay through the output buffer circuit 100 will be longer. Similarly, a higher value of clamp voltage on that node up1 107 will reduce the delay through the output buffer circuit 100, but it will increase the amplitude of the oscillation.

The levels of the clamp voltage at nodes up1 107 and dn1 109 have been chosen as described below, to be approximately $V_{cc}$ minus 3 times the values of the p channel and $V_{ss}$ plus 3 times of n channel thresholds, respectively. Other values of clamp voltages which are between $V_{ss}$ and $V_{cc}$ values, may also be used here. The value of the clamp voltage provides a trade off between the amplitude of the output oscillation and the total propagation delay through the bus driver circuit. Therefore, for example, a higher clamp voltage at node up1 107 or a lower voltage on node dn1 109 will reduce the oscillation amplitude, but the delay through the output buffer circuit 100 will be longer. Similarly, a higher value of clamp voltage (with reference to the corresponding power supply), on those nodes will reduce the delay through the output buffer circuit 100, but will increase the amplitude of oscillation.

Figure 3B:
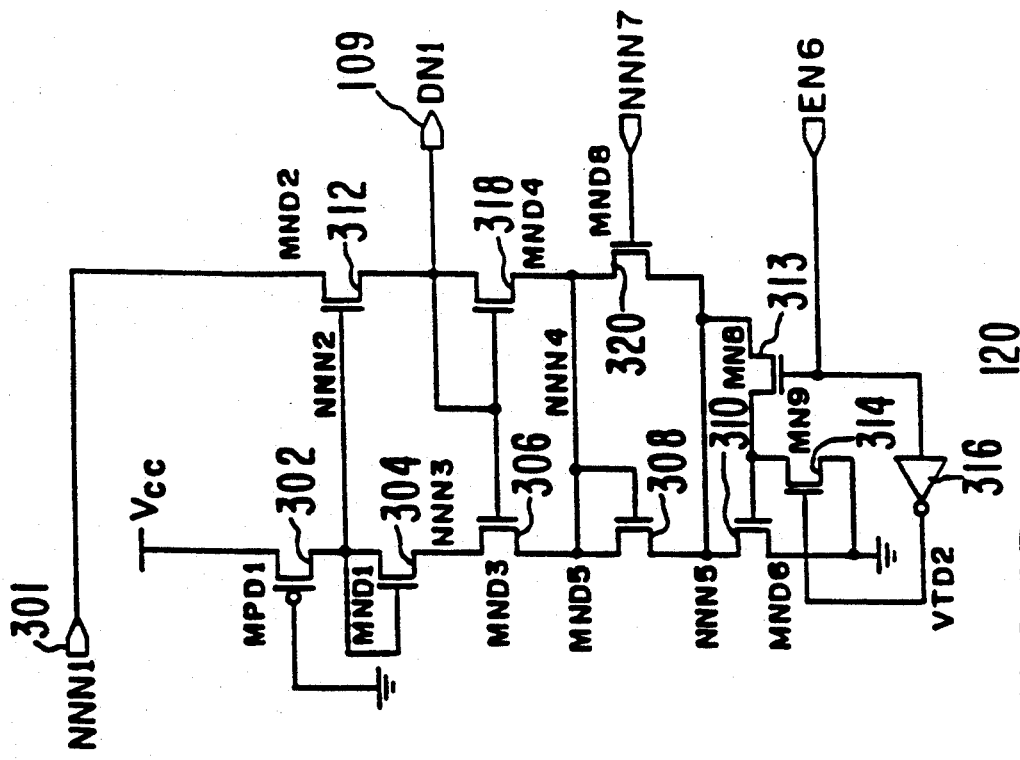
FIG. 3(b) shows an embodiment of a n-type reference generator circuit in accordance with the present invention.
Figure 3A:
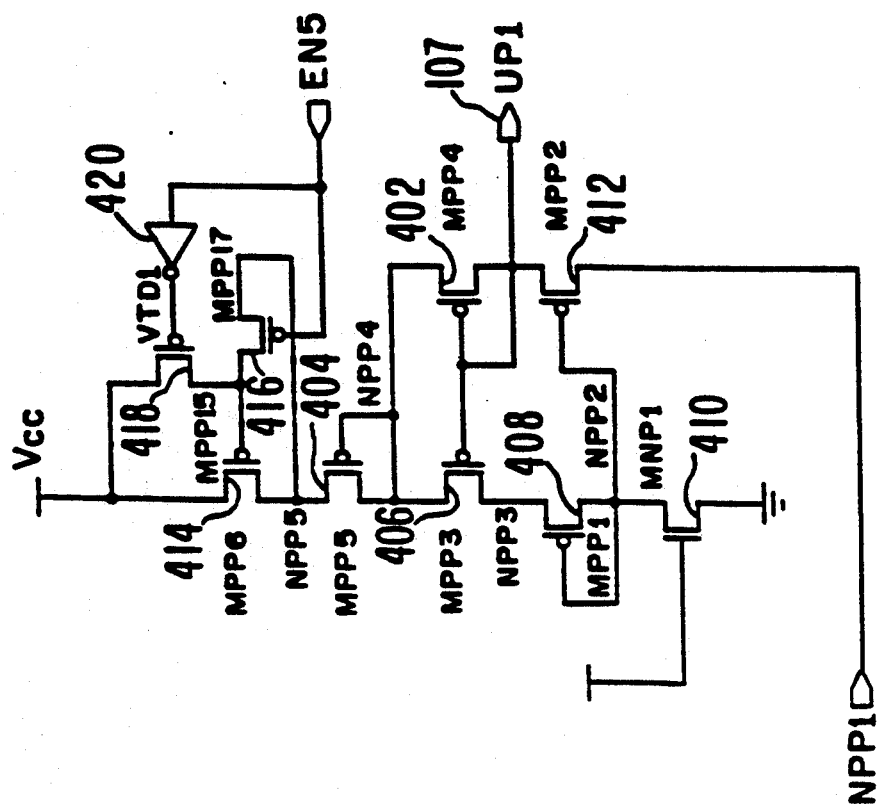
FIG. 3(a) shows an embodiment of a P-type reference generator circuit in accordance with the present invention.

The basic schematics of the Ref__n and Ref__p generator circuits 118 and 120 are shown in FIG. 3(a) and FIG. 3(b) respectively. These reference generators have been substantially disclosed in U.S. patent application Ser. No. 07/895,288, entitled "High Speed Output Buffer Circuit That Provides Minimum Output Signal Oscillation." The reference generator circuits 118 and 120 described below in FIG. 3(a) and FIG. 3(b) are similar to those shown in FIG. 4(b) and FIG. 4(a) of the above referenced patent application. Voltage reference generator circuit 120 mostly employ n-type transistors. The voltage reference generator circuit 120 includes the nnn1 input 301 coupled to the drain of mnd2 nmos transistor 312. The source of transistor 312 is coupled to the dn1 109 signal.

The gate of transistor 312 is coupled to the gate of mnd1 n-mos transistor 304 and the drain of mpd1 pmos transistor 302. The source of transistor 302 is coupled to $V_{cc}$ and the gate of transistor 302 is coupled to $V_{ss}$. The gate of transistor 304 is coupled to its drain and the source of transistor 304 is coupled to the drain of mnd3 nmos transistor 306.

The source of transistor 306 is coupled to the drain of mnd5 nmos transistor 308. The gate of transistor 306 is coupled to the gate of mnd4 nmos transistor 318. The drain of transistor 308 is coupled to its gate and the source of transistor 308 is coupled to the drain of mnd6 nmos transistor 310 and the drain of mn8 nmos transistor 313. The gate of transistor 310 is coupled to the source of transistor 313 and the drain of mn9 nmos transistor 314.

The gate of transistor 313 is coupled to input EN6 and the input of invertor 316. The output of invertor 316 is coupled to the gate of transistor 314. The source of transistor 314 is coupled to $V_{ss}$. The gate and drain of mnd4 n-mos transistor 318 is coupled to dn1 109.

The drain of mnd8 nmos transistor 320 is coupled to the drain and gate of transistor 308 and the source of transistor 318. The gate of transistor 318 is coupled to the source of transistor 312. The gate of transistor 320 is coupled to input NNN7.

Voltage reference generator circuit 118 employs mostly p-type transistors. The voltage reference generator circuit 118 includes the npp1 input 401 coupled to the drain of mpp2 pmos transistor 412 and the source of transistor 412 is coupled to the up1 signal 107. The gate of transistor 412 is coupled to the gate and drain of mpp1 transistor 408 and the drain of mnp1 nmos transistor 410. The gate of transistor 410 is coupled to $V_{cc}$. The source of mpp1 p-mos transistor 408 is coupled to the drain of mpp3 pmos transistor 406.

The source of transistor 406 is coupled to the drain of mpp5 pmos transistor 404. The drain of transistor 406 is coupled to the source of transistor 408. The gate of transistor 406 is coupled to the gate of transistor 402. The source of transistor 402 is coupled to gate of transistor 404. The drain of transistor 402 is coupled to up1 107. The drain of transistor 404 is coupled to its gate and the source of transistor 404 is coupled to the drain of mpp6 p-mos transistor 414. The gate of transistor 414 is coupled to the source of mpp17 pmos transistor 416 and its source is coupled to $V_{cc}$.

The drain of transistor 416 is coupled to the drain of transistor 414. The drain of transistor 418 is coupled to the source of transistor 416 and gate of transistor 414. EN5 is coupled to the gate of transistor 416 and an input of invertor 420. The output of invertor 420 is coupled to the gate of transistor 418.

Voltage generators 118 and 120 in essence a pair of voltage divider circuits designed in a current mirror configuration. They are designed to deliver clamp voltages of approximately 3 volts above the $V_{ss}$ (ground) level at node dn1 109 and approximately 3 volts below $V_{cc}$ (power supply) level at node up1 107. The load transistors, transistor 302 of the Ref__n generator 120 and transistors 140 of the Ref__p 118 generator are weak devices.

In the Ref__n generator 120, the sizes of the saturated series transistors 304, 306, 308 and 310 (en6 "high") are all ratioed such that nodes nnn2, nnn3, nnn4 and nnn5 are each at approximately at $V_{T-n}$ level higher than its source voltage. Thus the resultant clamp voltage obtained at the output of this reference voltage generator 120 (node dn1 109) is about 3 $V_{T-n}$ above ground. By applying the same design technique, the clamp voltage obtained at node up1 107 of the Ref__p voltage generator 118 (en5 "low") is about 3 $V_{T-p}$ below $V_{cc}$.

The Ref__n generator 120 in FIG. 3(b) has an additional feature built into it. A shunting transistor 320 shorts the saturated transistor 308 when signal nnn7 is high. This causes the Ref__n generator 120 to lower its output voltage level at dn1 109 by about a $V_{T-n}$ value. With node nnn7 high, the clamp voltage thus delivered at dn1 109 is now $V_{ss}$ plus 2 $V_{T-n}$ or approximately, 2 volts above $V_{ss}$.

As will be shown later, this configuration of the referenced generator allows ramping the voltage at node dn1 109 in two piece wise steps, first to 2 volts (nnn7=high) and then to the final clamp level (nnn7=low) of 3 volts. Although it has not been described here in this specification, the same technique of obtaining a controlled ramp of the voltage can be used on the Ref_p generator 120, if desired. This will ramp the voltage at node up1 107 first to "$V_{cc}-2$" volts level and then to a "$V_{cc}-3$" volts level.

In FIG. 3(b), when node nnn1 pulls node dn1 109 down, it cuts off transistor 306. This causes node nnn2 to rise to the $V_{cc}$ level. Node nnn3 which is the source of the saturated n channel transistor 304, reaches a voltage of "$V_{cc}-V_{T-n}$." The signal nnn7 is generated by node dn1 109 through a delay circuit 122 (FIG. 1) and it has inverse polarity of dn1 109.

Therefore, with dn1 109 low, nnn7 shunts current through transistor 320, instead of transistor 308. When nnn1 is low node en6 (FIG. 1) is kept high. This causes the saturated transistor 310 to be on. However, the generator does not draw any power under these conditions, since transistors 306 and 318 are off. When node nnn1 starts rising, it pulls node dn1 109 by the source following action. As dn1 109 rises, transistor 306 turns on. This action starts pulling node nnn2 down. Since the shunting transistor 320 is on, the transient voltage rise at node dn1 109 and voltage fall at node nnn2 are about "$V_{ss}+2\ V_{T-n}$" and $V_{ss}+3\ V_{T-n}$", respectively Immediately following this, the voltage level of node dn1 109 causes node nnn7 to fall to ground. As this happens, the shunting transistor 320 turns off. This allows voltage levels at nodes dn1 109 to climb again and voltage at nodes nnn2 and nnn3 both start climbing as well. The rising node dn1 109 and node nnn3, both become clamped at the 3 $V_{T-n}$ voltage levels. At this point all transistor except the p channel load 302 are in saturation. The total dc current drawn by this generator is the sum of the current drawn through the transistors 302 and 312. It is however limited by the transistor 310 (constant current source) which is weakly turned on by having both its drain and source at about 1 $V_{T-n}$ above the ground level.

The schematic of Ref_p voltage generator 118 (FIG. 2b) is complementary in nature to the Ref_n voltage generator 120. Its transistor sizes have been ratioed to provide 4, 3, 2 and 1 $V_{T-p}$ below the level of $V_{cc}$ at nodes npp2, npp3, npp4 and npp5, respectively. It operates as follows.

When node npp1 is high, up1 is pulled high which cuts off transistor 406. The node npp2 drops to $V_{ss}$ and puts transistor 412 in linear region. The node npp3 which is the source of the saturated p channel transistor 408, reaches a voltage of $V_{ss}$ plus $V_{T-p}$. At this time node en5 (FIG. 1) is kept low. This causes the saturated transistor 414 to be on.

However, the generator 118 does not draw any power under these conditions, since transistors 406 and 402 are off. When node npp1 401 starts falling, it pulls node up1 down by the source following action. As up1 107 falls, transistor 406 turns on and all the transistors in that current path also turn on.

This action starts pulling node npp2 up to the "$V_{cc}-4\ V_{T-p}$" level. The falling node up1 and rising node npp3 become clamped to the "$V_{cc}-3\ V_{T-p}$" voltage level. At this point all transistors except the n channel transistor 410 are in saturation. The total current flowing through this reference circuit is limited by the constant current source 414 which is weakly turned on by having its drain and gate at about 1 $V_{T-p}$ level over its source $V_{cc}$.

The size of the transistor 312 (FIG. 3(b)) and the invertor 116 driving the node nnn1 (FIG. 1) determines the slew rate of node dn1 109. Similarly, the size of the transistor 412 (FIG. 3(a)) and the invertor 114 driving the node npp1 (FIG. 1) determines the slew rate of node up1 107.

As mentioned above, both the generators 118 and 120 are powered down when node nnn1 and node npp1 are pulled low and high, respectively. The generators 118 and 120 are also powered down at another event. It takes place when the output dn1 109 and up1 107 of these generators need to be pulled to their full cmos levels. This is done after these nodes have first reached their desired clamp voltage levels of "$V_{ss}+3\ V_{T-n}$" and "$V_{cc}-3\ V_{T-p}$".

In Ref_n generator 120, the power down is achieved by having the signal en6 low. This turns off transistor 310 and enables node dn1 109 to be pulled to the $V_{cc}$ level. Similarly, by having signal en5 high, the transistor 414 of Ref_p generator 120 is turned off. Under these circumstances, it enables node up1 107 to be pulled to $V_{ss}$ level without causing any dc power drain.

The benefits of reference voltage generators 118 and 112 are as follows:

1) The generators provide large current gain in driving the loads of the large bus driver transistors nm1 and mp1, during initial transition.

2) The clamp reference voltage levels of the generators are less susceptible to the power supply variations.

3) The dc current paths of these generators are cut off when they are powered down.

4) Since the value of the transistor threshold decreases at the best case speed process center, the foremost advantage of these reference generator circuits is that the level of the clamp voltage also decreases at best case speed corner.

The voltages on nodes dn1 109 and up1 107 and in relationship to the ground ($V_{ss}$) or $V_{cc}$ decreases or increases respectively, in value at the best case speed process. As a result, the lower clamp voltage helps in controlling the current flow through the bus driver transistors 136 and 138 at the best case process corner. Consequently, the output oscillation is minimized even at the best case process corner.

The output buffer circuit 100 in FIG. 1 provides the same amount of propagation delay for both the "data to out" and "enable to out" access paths. It also provides fast access for tri-stating the bus driver transistors mn1 and mp1 when signal enable is pulled low. As mentioned above, the bus driver circuit prevents simultaneous turn on of the large bus driver transistors 136 and 138.

Figure 4:
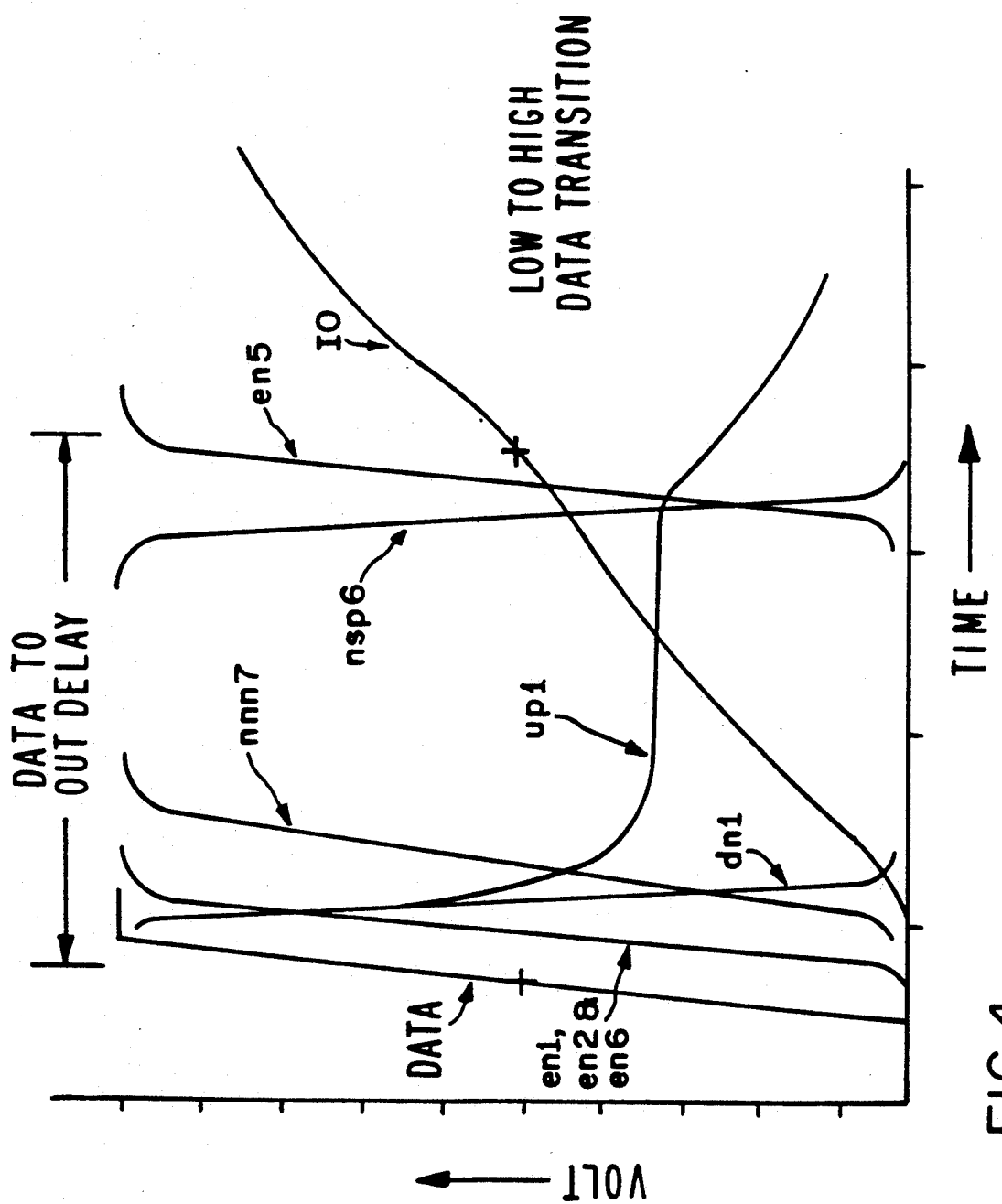
FIG. 4 is a graph showing various signals in the output buffer circuit of FIG. 1 during a high voltage to low voltage transition.
Figure 5:
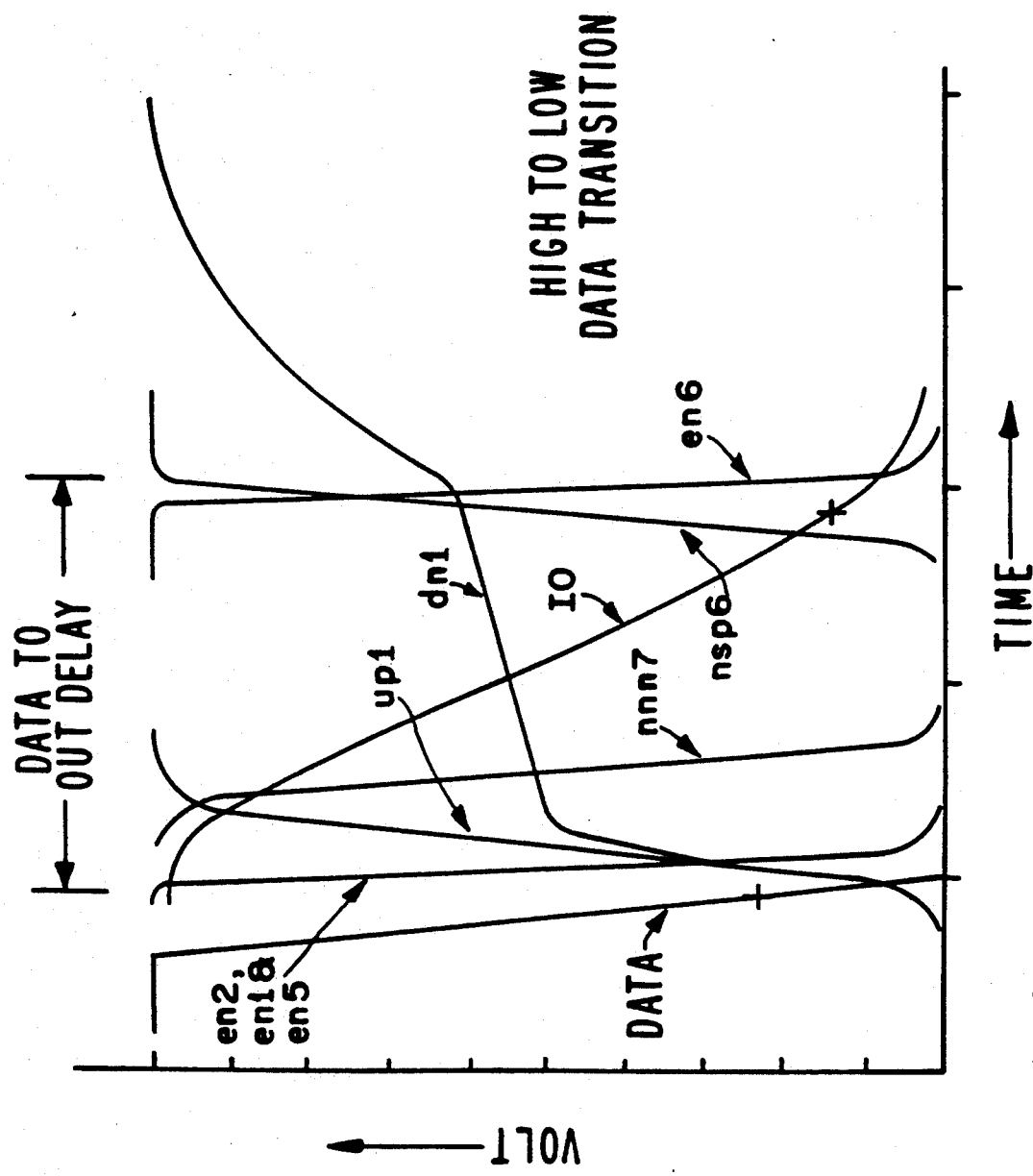
FIG. 5 is a graph showing various signals of the output buffer circuit of FIG. 1 during a low voltage to high voltage transition.

FIG. 4 shows a graph of various signals in the output buffer circuit 100 when data goes from a low to high transition. FIG. 5 shows a graph of various signals in the output buffer circuit 100 when data goes from high to low transistors. Following is a step by step sequence of operation of the output buffer circuit in accordance with those Figures (referring first to FIG. 4).

With "enable" as high, "data" going from low to high caused node DATA (FIG. 1) to go from low to high and both nodes en1 and en2 to go from low to high. High transition of DATA also pulls node en6 high causing transistor 132 to turn off. Simultaneously, transistor 134 and node nnn1 together starts pulling node dn1 109 low. This puts the Ref_n generator 120 into a power down mode. A high level at node en1 turns off transistor 128, which was keeping node up1 107 high.

The falling npp1 powers up the Ref_p generator 118 causing node up1 107 to make transition from high to low. Falling node up1 107 turns on the p channel driver transistor 138 and the IO node 146 begins to rise. The node up1 107 becomes clamped at a voltage level of "$V_{cc} - 3\ V_{T-p}$". When node 146 reaches a certain threshold level, node nsp6 goes low after some delay. The delay is provided inside the block labeled in_delay 142.

The input sleep to this block is held low in order to enable this "In Delay" buffer 142. The In-Delay 142 is typically an input buffer which is enabled by having the input sleep signal at a low state. Falling node nsp6 causes en5 to make a transition from low to high. A high going en5 powers down the Ref_p generator and pulls node up1 down to $V_{ss}$ by transistor mnp2, which is a weak level correcting transistor. With up1 at $V_{ss}$, transistor mp1 receives full gate drive and maximizes its current sourcing.

Referring now to FIG. 5, with "enable" as high, "data" going from high to low causes node DATA (FIG. 1) to go from high to low and both nodes en1 and en2 to go from high to low. High transition of DATA pulls node en5 low, causing transistor 130 to turn off. Simultaneously, transistor 128 and node npp1 together starts pulling node up1 107 high. This puts the Ref_p generator 118 into a power down mode.

A low level at node en2 turns off transistor 134, which was keeping node dn1 109 low. The rising nnn1 powers up the Ref_n generator 120 causing node dn1 109 to make transition from low to high. Rising node dn1 turns on the driver transistor 136 and the output node 146 begins to fall.

Initially, a high level at node nnn7 causes node dn1 109 to clamp at about "$V_{ss} + 2\ V_{T-n}$" level. When this level is reached on node dn1, the level at dn1 109 causes node nnn7 to go low after some delay. This delay is provided through the delay 122. With node nnn7 pulled low, node dn1 109 resumes its rise until it becomes clamped at a voltage level of "$V_{ss} + 3\ V_{T-n}$." When node IO 146 reaches a certain threshold level, node nsp6 goes high after some delay.

This delay is provided in the in_delay 142 with input pin "sleep" held low. A high nsp6 causes en6 to make transition from high to low. A high on node en6 powers down the Ref_n generator 120 and pulls node dn1 to $V_{cc}$ by transistor 132, which is a weak level correcting transistor. With dn1 at $V_{cc}$, transistor 136 receives full gate drive and maximizes its current sinking capability.

When the signal "enable" is low, node en1 is low and node en2 is high. At the same time, en5 is low and en6 is high. The resultant effect is that the IO 146 is tri-stated by having node up1 107 high by transistor mp10 and node dn1 109 low by transistor mn20. If "data" is at a high level and "enable" makes a transition from low to high, the low level at node dn1 109 is unaffected, since levels at nodes en2, nnn1, nnn7 and en6 remain unchanged.

As "enable" rises, if the level at node nsp6 was already low, node en5 will be pulled high. A low level at node nsp6 may be present if the level of the tri-stated IO 146 is sensed as a "high" level by the input stage of the "in delay" buffer 142. This will cause en5 to be high. A high en5 will power down the Ref_p generator 118 and turn on the transistor 130. Under this circumstance, the node up1 107 will be pulled low by both node npp1 and transistor 130.

The node up1 107 will not experience the brief clamping of voltage provided by the Ref_p generator 118. The current flow through the driver transistor 138 is however regulated by its lower drain to source voltage. Since transistor 130 is a weak transistor, it does not contribute too much to the falling slope of node up1 107 and thereby, does not aggravates its slew rate.

If the level of nsp6 is high when "data" is high and "enable" begins to rise, en5 will be kept low by nsp6 and en6 will be high. The transition of nodes up1 107, IO 146, nsp6 and en5 (FIG. 1) under the circumstances, will be the same as described in the above-mentioned description of FIG. 4.

If "data" is at a low level and "enable" makes a transition from low to high, the high level at node up1 is unaffected, since levels at nodes en1, npp1 and en5 remain unchanged. As "enable" rises, if the level at node nsp6 was already high, node en6 will be pulled low. A high level at node nsp6 may result if the level of the tri-stated IO 146 is lower than the threshold of the input stage of the "in_delay" buffer 142, causing the input stage to sense a low level. This will cause en6 to go low. A low en6 will power down the Ref_n generator 120 and turn on the transistor 132.

Under this circumstance, the node dn1 109 will be pulled high by both node nnn1 and transistor 132. The node dn1 109 will not experience the brief clamping of voltage provided by the Ref_n generator 120. The current flow through the driver transistor 136 is regulated by its lower drain to source voltage. Since 132 is a weak transistor, it does not contribute too much to the rising slope of node dn1 and thereby, does not aggravates its slew rate.

If the level of nsp6 was low when "data" is low and "enable" begins to rise, en5 will remain low and en6 will be kept high by nsp6. The transition of nodes dn1 109, nnn7, IO 146, nsp6 and en6 under the circumstances, will be the same as described in the above-mentioned description of FIG. 5.

As mentioned earlier, other values of clamp voltage at nodes up1 107 and dn1 109 may have been chosen in order to lower the buffer delay or the output oscillation. For example, in the Ref_n generator 120 of FIG. 2(b), if one of the saturated driver transistors of these generators is replaced by a shorting net, the clamp voltage value can be made as $V_{ss}$ plus 2 times the value of the threshold.

Similarly, by adding an additional saturated driver transistor into the chain of driver transistors, the level of the clamp voltage can be raised to $V_{ss}$ plus 4 times of the threshold value. Removal of transistors 310 (having node nnn5 grounded) and 414 (having node npp5 tied to $V_{cc}$) will cause both these generators 118 and 120 to produce Reference voltages of approximately "$V_{ss} + 2\ V_{T-n}$" at node dn1 109 and "$V_{cc} - 2\ V_{T-p}$" at node up1 107. Similarly, an additional saturated nmos transistor between transistors 308 and 310 (FIG. 3(b)) and an additional saturated pmos transistor between transistors 404 and 414 (FIG. 3(a)) will transform both these generators of FIG. 3(b) and in FIG. 3(a) into 4 $V_T$ generators with approximately a "$V_{ss} + 4\ V_{T-n}$" level at node dn1 and approximately a "$V_{cc} 4\ V_{T-p}$" level at node up1.

The wave shapes shown in FIGS. 4 and 5 are approximations and may be slightly different in amplitude or duration based upon the specific operating and semiconduction processing conditions. However, the transitions shown should be similar to those shown in the Figure despite changes in the operating conditions, such as power supply variations and the like, as well as for most semiconductor processing modifications.

Although the present invention has been described in accordance with the embodiment shown in the Figures, one of ordinary skill in the art recognizes that there could be variations to the embodiment and those variations would be within the spirit and scope of the present invention. Accordingly, many modifications may be made by one of ordinary skill without departing from the spirit and scope of the present invention, the scope of which is defined solely by the appended claims.

I claim:

1. A high speed output buffer circuit for minimizing output signal oscillation and steady state current comprising:

first and second drive transistors,
   a pair of reference voltage generators, one of the pair of voltage generators coupled to the first drive transistor, the other of the pair of voltage generators being coupled to the second drive transistor, one of the pair of voltage generators including primarily p-type transistors, the other of the pair of the voltage generators including primarily n-type transistors, each of the reference voltage generators being coupled in a current mirror configuration,
   means responsive to the pair of voltage generators for providing a controlled ramping of the output voltage of at least one of the drive transistors to minimize steady state current output signal oscillation; and
   means coupled to the pair of voltage generators for shutting down the pair of reference generator when the output oscillation has subsided to some acceptable level.

2. The high speed output buffer circuit of claim 1 in which each of the reference generators comprises:
   a plurality of transistors connected in series and ratioed such that each of the plurality of transistors has a threshold voltage that is a level higher than the preceding one, and
   a load transistor coupled to the plurality of series transistors.

3. The output buffer circuit of claim 1 in which a first reference voltage generator provides a clamp voltage which is two threshold voltages above $V_{ss}$ and a second reference voltage generator provides a clamp voltage which is two threshold voltages below $V_{cc}$.

4. The output buffer circuit of claim 1 in which the first reference generator provides a clamp voltage which is three threshold voltages above $V_{ss}$ and a second reference voltage generator in which the clamp voltage is three threshold voltages below $V_{cc}$.

5. The output buffer circuit of claim 1 in which the first reference voltage generator provides a clamp voltage which is four threshold voltages above $V_{ss}$ and a second reference voltage generator which is four threshold voltages below $V_{cc}$.

6. The output buffer circuit of claim 2 in which in each of the reference voltage generators, the plurality of series transistors are driven to saturation and the load transistor is weakly turned on.

7. The output buffer circuit of claim 2 in which the providing means comprises a means for shorting one of the series transistors in one of the reference voltage generators to change the clamp voltage when an input to the reference voltage generator is active.

8. The output buffer circuit of claim 2 in which the shutting down means comprises:
   means for driving the first and second driver transistors to their full CMOS voltage levels after the output signal oscillation has subsided to an acceptable level.

9. A high speed output buffer circuit for minimizing output signal oscillation and steady state current comprising;
   a nmos driver transistor,
   a pmos driver transistor,
   a first reference voltage generator coupled to the nmos driver transistor, the first reference voltage generator including primarily a plurality of nmos transistors, the plurality of nmos transistors being connected in a series fashion and in a circuit mirror configuration, the plurality of transistors being connected such that each of the transistors is at a threshold higher than the immediately preceding transistor,
   a second reference voltage generator coupled to the pmos driver transistor, the second reference voltage generator including primarily a plurality pmos transistors, the plurality of pmos transistors being connected in a series fashion and in a current mirror configuration, the plurality of transistors being connected such that each of the transistors is at a threshold voltage lower than the preceding transistor, and
   means reponsive to the first and second voltage generators for shutting down the appropriate reference voltage generator when the output oscillation has subsided to an acceptable level.

10. A high speed output buffer circuit for minimizing output signal oscillation and steady state current comprising:
    first and second drive transistors,
    a pair of reference voltage generators, one of the pair of voltage generators coupled to the first drive transistor, the other of the pair of voltage generators being coupled to the second drive transistor, one of the pair of voltage generators including primarily p-type transistors, the other of the pair of the voltage generators including primarily n-type transistors, each of the reference voltage generators being coupled in a current mirror configuration, and
    means responsive to the pair of voltage generators for providing a controlled ramping of the output voltage of at least one of the drive transistors to minimize steady state current output signal oscillation.

11. A high speed output buffer circuit for minimizing output signal oscillation and steady state current comprising:
    first and second drive transistors,
    a pair of reference voltage generators, one of the pair of voltage generators coupled to the first drive transistor, the other of the pair of voltage generators being coupled to the second drive transistor, one of the pair of voltage generators including primarily p-type transistors, the other of the pair of the voltage generators including primarily n-type transistors, each of the reference voltage generators being coupled in a current mirror configuration, and
    means coupled to the pair of voltage generators for shutting down the pair of reference generators when the output oscillation has subsided to some acceptable level.

* * * * *

UNITED STATES PATENT AND TRADEMARK OFFICE
CERTIFICATE OF CORRECTION

PATENT NO. : 5,248,906

DATED : September 28, 1993

INVENTOR(S) : Mahmood

It is certified that error appears in the above-identified patent and that said Letters Patent is hereby corrected as shown below:

On the title page, item [75] should read --Qazi Mahmood--.

Signed and Sealed this

Twelfth Day of May, 1998

Attest:

BRUCE LEHMAN

Attesting Officer

Commissioner of Patents and Trademarks